US010573541B2

(12) United States Patent
Stone

(10) Patent No.: US 10,573,541 B2
(45) Date of Patent: Feb. 25, 2020

(54) SYSTEM FOR SEMICONDUCTOR WAFER RETENTION AND SENSING IN A VACUUM LOAD LOCK

(71) Applicant: Axcelis Technologies, Inc., Beverly, MA (US)

(72) Inventor: Stanley W. Stone, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 508 days.

(21) Appl. No.: 15/361,813

(22) Filed: Nov. 28, 2016

(65) Prior Publication Data

US 2018/0151407 A1    May 31, 2018

(51) Int. Cl.
*B25B 11/00* (2006.01)
*H01L 21/67* (2006.01)
*H01L 21/687* (2006.01)

(52) U.S. Cl.
CPC .. *H01L 21/67115* (2013.01); *H01L 21/67259* (2013.01); *H01L 21/68728* (2013.01)

(58) Field of Classification Search
CPC .. B25B 11/00; B25B 5/00; B25B 1/00; B23Q 1/03
See application file for complete search history.

(56) References Cited

U.S. PATENT DOCUMENTS

| 3,424,319 A * | 1/1969 | Darash | B23Q 3/082 |
| | | | 198/341.02 |
| 2008/0047120 A1* | 2/2008 | Soroka | B23Q 1/01 |
| | | | 29/27 C |
| 2008/0185488 A1* | 8/2008 | Garry | B23Q 1/035 |
| | | | 248/223.21 |
| 2013/0263437 A1* | 10/2013 | Buzzi | F04D 29/662 |
| | | | 29/559 |

* cited by examiner

*Primary Examiner* — Lee D Wilson
(74) *Attorney, Agent, or Firm* — Eschweiler & Potashnik, LLC

(57) ABSTRACT

A workpiece clamp has a base with first and second sides with a cam ring rotatably coupled to the first side. The cam ring has plurality of cam slots. An actuator selectively rotates the cam ring with respect to the base. A plurality of rotary clamps, have respective shafts, cam followers assemblies, and workpiece engagement members, where the shaft extends through the base from the first to second side and rotate about an axis. The shaft has individually rotatable first and second members. The cam follower assemblies couple first and second portions of the shaft, where a cam follower is radially offset from the shaft axis and configured to engage a respective cam slot. The workpiece engagement member has a gripper member that is radially offset from the shaft axis and is configured to engage a workpiece based on a position of the cam follower in the respective cam slots. Sensors are positioned on the first side of the base, wherein each sensor detects a rotational position of the first and second members, thus determining a clamping state of each rotary clamp.

26 Claims, 8 Drawing Sheets

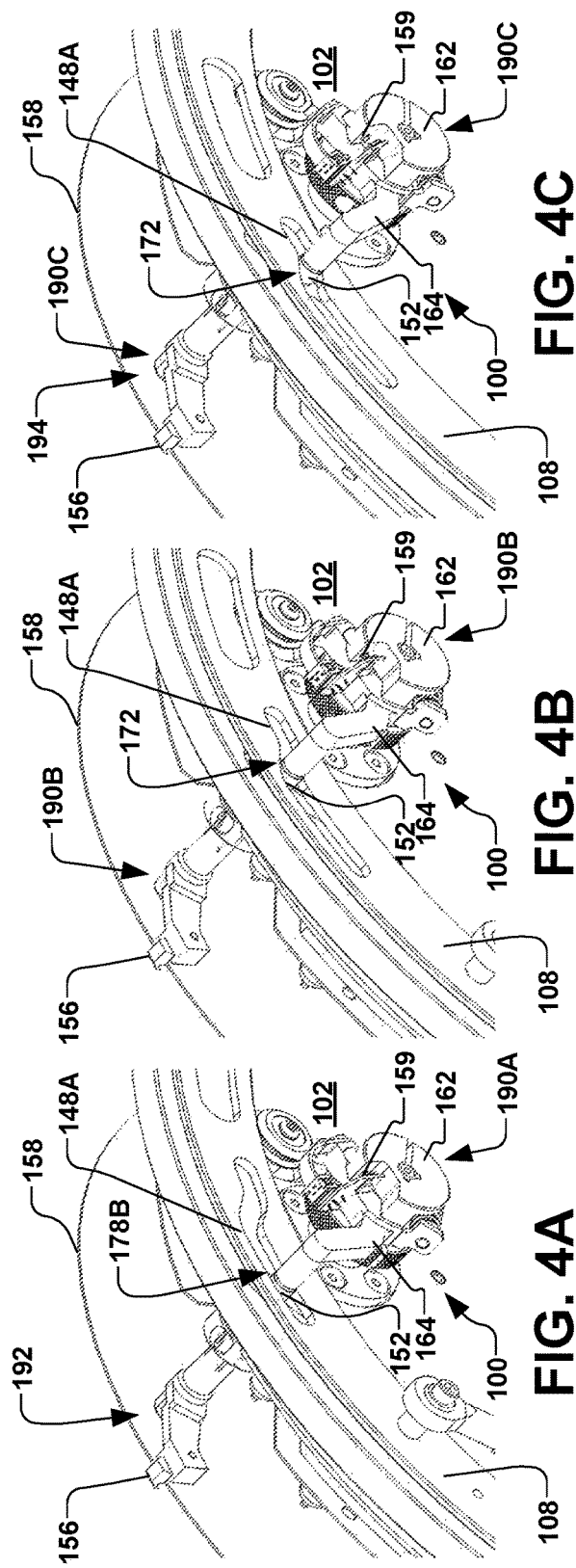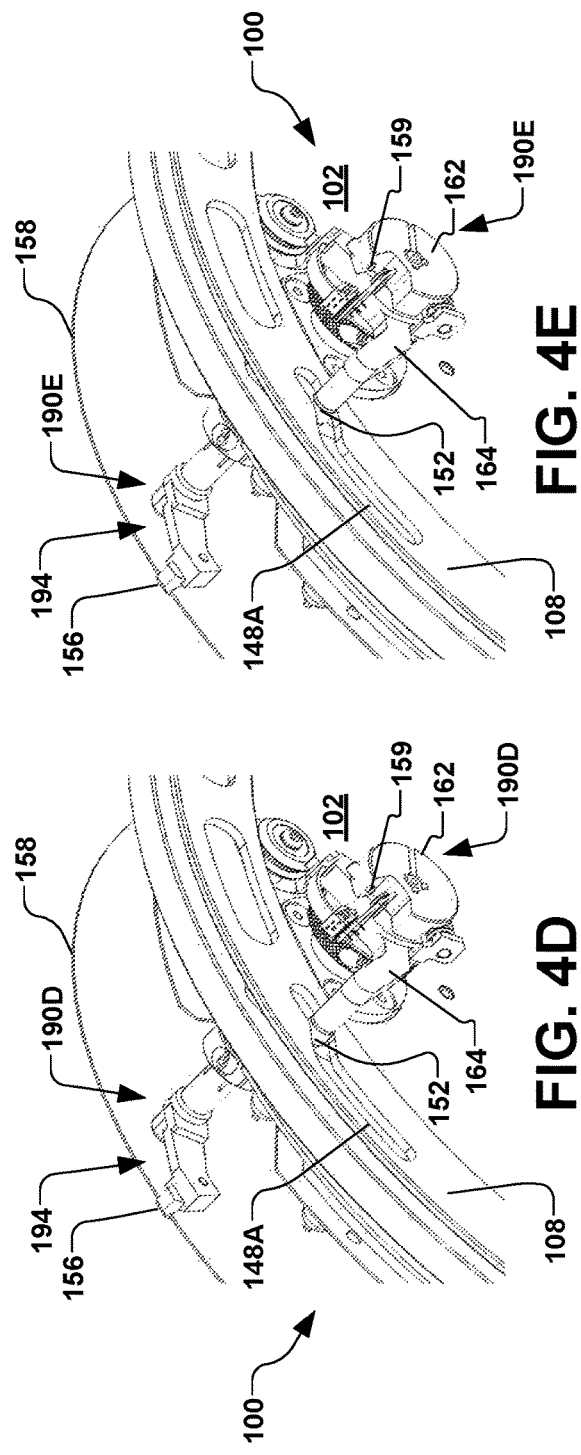

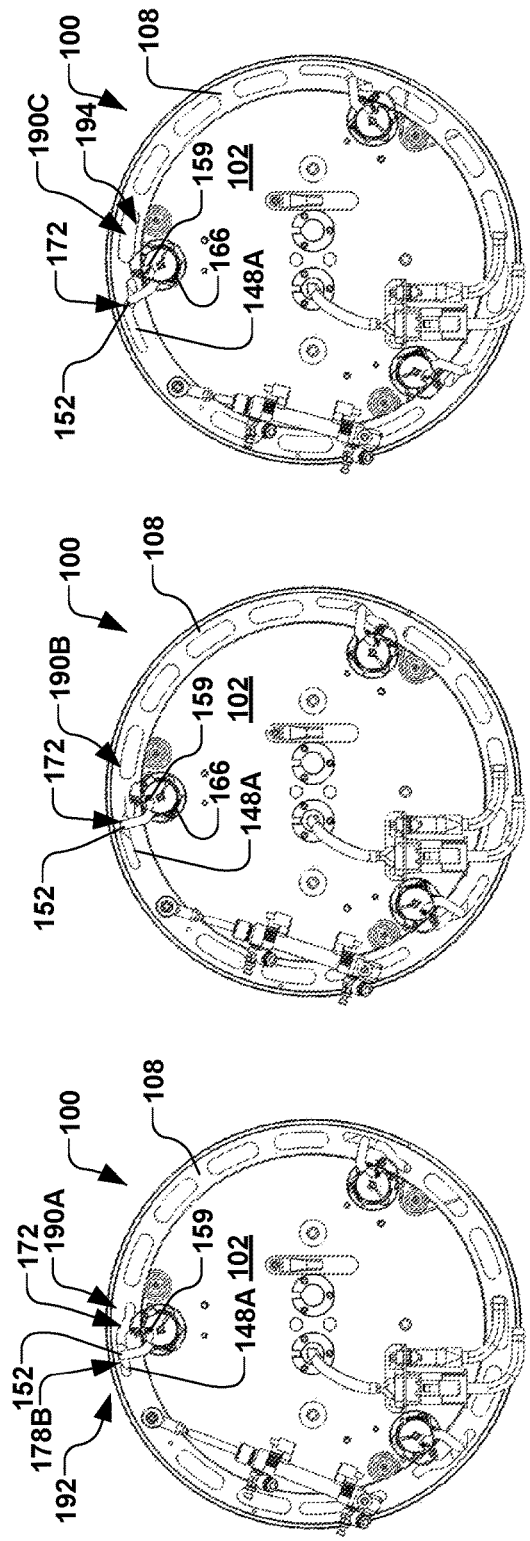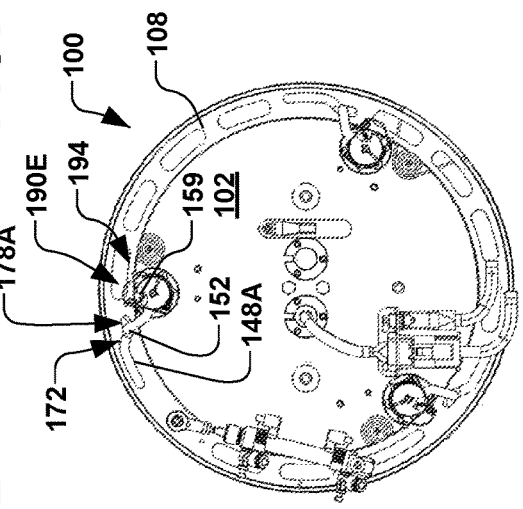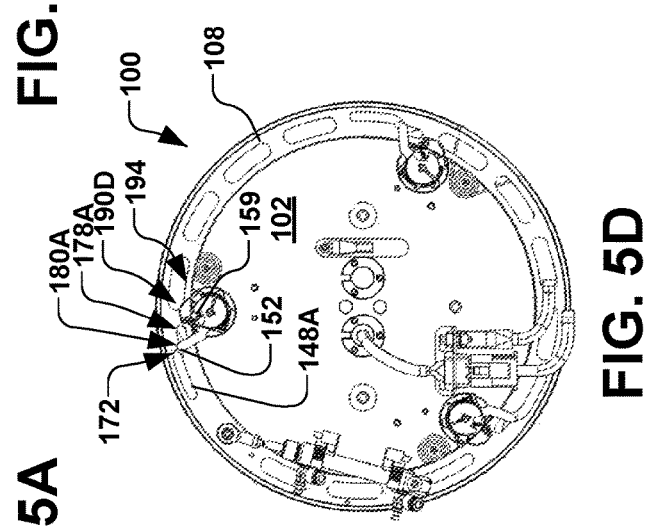

SYSTEM FOR SEMICONDUCTOR WAFER RETENTION AND SENSING IN A VACUUM LOAD LOCK

TECHNICAL FIELD

The present invention relates generally to semiconductor processing systems, and more particularly to system and apparatus for selectively retaining and remotely sensing a presence of a workpiece.

BACKGROUND

In semiconductor processing systems, a workpiece, such as a silicon wafer, is commonly positioned by a workpiece retaining apparatus. In some systems, a wafer is transferred from an atmospheric environment into a load lock chamber, where after evacuation of air from the load lock chamber, the wafer is transferred to an electrostatic chuck or platen for subsequent processing, such as an ion implantation. Once processing of the wafer is complete, the process is reversed and the wafer is removed from the electrostatic chuck and returned back to atmosphere via a similar load lock chamber. In some ion implantation systems, such as the Optima HD systems manufactured by Axcelis Technologies of Beverly, Mass., the wafer is further positioned on a pivoting mechanism having a load platen that is horizontal for transfers of the wafer in atmosphere, while being vertically positioned for transfers of the wafer in vacuum. In such a system, the load platen generally defines a door of load lock chamber in the vertical position.

In operation of the load platen, a transfer location is provided for the wafer to be dropped off by an atmospheric robot, whereby the wafer is positioned on pins, whereby clamps, commonly referred to as grippers, are positioned around a periphery of the wafer to hold the wafer during the transition from the horizontal to the vertical orientation via the pivoting mechanism. As such, sensing of the wafer as being properly held by the grippers is desirable in order to ensure secure wafer handling. Such sensing is typically provided in the vacuum environment of the load lock chamber to ensure proper positioning of the wafer therein.

Conventionally, the pins on which the wafer rests are adjustable to provide the proper location of the wafer for the atmospheric robot to place the wafer thereon. It is desirable, for example, for the grippers to clamp the wafer without shifting the position of the wafer, as misalignment of the wafer with respect to the grippers can cause a generation of particles that can decrease the yield of the semiconductor process. The grippers, for example, are further actuated by a gripper actuation system in a controlled manner in order to reduce chances of particle generation. Since the wafer is gripped while it is in the vacuum environment, and in-vacuum actuators are generally expensive and complicated, the gripper actuation system is typically located on the atmospheric side of assembly.

However, such a conventional system has several drawbacks. For example, in some ion implantation steps, the wafer may be cooled (e.g., to approximately −50° C.) during implantation. In order to prevent condensation on the wafer when returning the wafer to atmospheric pressure, the wafer should be near the ambient temperature (e.g., above the dew point of the atmospheric air) when the load lock is vented to expose to the atmosphere. If this is not the case, water from the atmosphere will condense on the wafer and potentially cause particles to adhere to the surface of the wafer. Thus, when the wafer is cooled during processing, the wafer is subsequently heated by a heater in the load lock chamber after the load lock chamber is vented with very dry gas (e.g., nitrogen having a low dew point). The heated gas thus warms the wafer to generally eliminate the condensation problem, but such heating can also cause electronic sensors associated with the workpiece sensing to fail when the sensors are proximate to the grippers.

For example, the heated gas is conventionally heated to a high temperature (e.g., approximately 250° C.) in order to raise the temperature of the wafer to approximately room temperature within a time period, such that the time period does not limit the throughput of wafers through the system. Accordingly, internal sensors associated sensing the gripping of the wafers within such systems commonly have a high failure rate due to the high temperatures involved, and the effect of such high temperatures on the electronic components of the sensors.

Further, conventional gripping systems often have difficulties in the placement of the grippers with respect to the wafer. For example, two opposing linear actuators are commonly used, whereby one gripper is coupled to one of the linear actuators, and two grippers are coupled to the other linear actuator, whereby a three-point contact with the wafer is achieved. Wafers are commonly misplaced by the atmospheric robot when the wafer and grippers are not adequately aligned or centered in such an arrangement. As such, mishandling and/or breakage of wafers can result from such misalignment. Furthermore, the pins on which the wafer rests typically require alignment to the grippers in order to prevent mishandling and particle generation. Accordingly, conventional systems have three support pins to adjust in height, as well three grippers to adjust in multiple dimensions, where such adjustments are commonly tedious and awkward, as well as typically requiring a high degree of skill to accomplish correctly.

SUMMARY

The present disclosure thus provides a system and apparatus for selectively retaining a workpiece in an isolated environment, as well as for remotely sensing the retention of the workpiece. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Thus, in accordance with the present disclosure, a workpiece clamp is provided, wherein the workpiece clamp comprises a base having a first side and a second side, wherein the first side is generally opposite the second side. A cam ring has a plurality of cam slots defined therein, wherein the cam ring and base are generally parallel with one another, and wherein the cam ring is rotatably coupled to the first side of the base. For example, a plurality of roller guides are operably coupled to the first side of the base, wherein the plurality of roller guides engage an inner diameter of the cam ring, therein rotatably coupling the cam ring to the base. In one particular example, the plurality of roller guides comprise one or more vee bearings, wherein the inner diameter of the cam ring is generally v-shaped.

An actuator is further operably coupled to the base and cam ring, wherein the actuator is configured to selectively rotate the cam ring with respect to the base. The actuator, for example, comprises a linear actuator, such as a piston and cylinder arrangement, wherein one of the piston or cylinder is operably coupled to the base, and wherein the other one of the piston or cylinder is operably coupled to the cam ring. One of a pneumatic source and hydraulic source, for example, is operably coupled to the piston and cylinder arrangement, wherein the respective one of the pneumatic source and hydraulic source is configured to extend and retract the piston with respect to the cylinder.

According to one example, the workpiece clamp further comprises a plurality of rotary clamps, wherein each of the plurality of rotary clamps respectively comprises a shaft, a cam follower, and workpiece engagement member. The shaft, for example, is rotatably coupled to the base, wherein the shaft passes through the base from the first side to the second side and is configured to rotate about a shaft axis. The cam follower assembly, for example, is operably coupled to a first portion of the shaft, wherein the first portion of the shaft is associated with the first side of the base. The cam follower assembly, for example, comprises a cam follower that is radially offset from the shaft axis and is configured to slidingly engage a respective one of the plurality of cam slots.

In a particular example, the first portion of each shaft further comprises a clutch apparatus, wherein the clutch apparatus comprises a first member fixedly coupled to the shaft and a second member fixedly coupled to the follower assembly. The second member, for example, is rotatably coupled to the shaft, whereby the first member and second member are individually rotatable about the shaft axis.

The clutch apparatus, for example, further comprises a spring member configured to rotationally bias the first member with respect to second member about the shaft axis toward a predetermined neutral position. For example, a spring constant associated with the spring member is associated with a predetermined clamping force between the gripper member and the workpiece when the gripper member engages the periphery of the workpiece. The first member and second member, for example, are thus configured to rotate in unison until the predetermined clamping force is reached, wherein upon exceeding the predetermined clamping force, the first member is configured to maintain a fixed rotational position while the second member is configured to rotate with respect to the first member, therein compressing the spring member.

The workpiece engagement member, for example, is operably coupled to a second portion of the shaft, wherein the second portion of the shaft is associated with the second side of the base. The workpiece engagement member, for example, comprises a gripper member that is radially offset from the shaft axis and is configured to selectively engage a periphery of a workpiece positioned on the second side of the base, wherein the selective engagement is based, at least in part, on position of the cam follower with respect to the respective one of the plurality of cam slots.

According to one example, each of the plurality of cam slots have a cam profile having at least a workpiece engagement portion. The workpiece engagement portion of the cam profile, for example, comprises a workpiece engagement slot having a varying radial distance to a center of the cam ring along a length thereof. The workpiece engagement portion of the cam profile, for example, is thus configured to rotate the second member of the clutch apparatus about the shaft axis a predetermined amount upon the cam follower translating with respect to the cam ring.

In another example, the cam profile further comprises one or more run-out portions adjoining one or more ends of the workpiece engagement portion, respectively. Each of the one or more run-out portions of the cam profile, for example, respectively comprises a radially constant slot having a respective constant radial distance to the center of the cam ring, wherein the one or more run-out portions of the cam profile are configured to maintain a respective rotational position of the second member of the shaft about the shaft axis.

Further, a plurality of sensors are respectively associated with the plurality of rotary clamps, wherein the plurality of sensors are further positioned on the first side of the base. Each of the plurality of sensors, for example, is configured to detect a rotational position of the respective shaft, wherein the rotational position of the respective shaft generally defines a clamping state of each of the plurality of rotary clamps, respectively. Each of the plurality of sensors, for example, is configured to sense a rotation of the first member with respect to the second member of each respective clutch apparatus, therein determining the clamping state of each respective rotary clamp. The plurality of sensors, for example, comprise one or more of a proximity sensor, a magnetic sensor, a hall sensor, and a switch operably coupled to one or more of the first member and second member of the clutch apparatus.

In accordance with another exemplary aspect of the disclosure, the base comprises a plurality of passages associated with each of the plurality of rotary clamps, respectively. Each of the plurality of passages, for example, comprises a sealing member, wherein the second portion of the respective shaft passes through the respective passage, and wherein the respective sealing member generally isolates a first environment associated with the first side of the base from a second environment associated with the second side of the base. Each sealing member, for example, may comprise a rotational vacuum feed-through, such as one or more of a ferrofluidic seal and an o-ring.

In one example, the base is operably coupled to a wall of a chamber, thus selectively generally enclosing the second environment therein. A seal, for example, is associated with a periphery of the base, and wherein the seal generally seals the first environment from the second environment. The chamber, for example, comprises a vacuum chamber selected from a group consisting of a load lock chamber, a thermal treatment chamber, and a process chamber. The base, for example, is rotatably coupled to the wall of the chamber via a hinge, wherein the base is configured to rotate about a hinge axis between a horizontal position and a vertical position. In another example, the base generally seals the second environment from the first environment in the vertical position and provides access to the second environment from the first environment in the horizontal position.

According to another example, one or more thermal devices are further positioned on the second side of the base, wherein the one or more thermal devices are configured to selectively heat the workpiece. For example, the base comprises a radiation source disposed on the second side thereof, wherein the radiation source is configured to selectively heat the workpiece. The radiation source, for example, comprises one or more of a heat lamp, a resistive heater, and a plurality of thermal LEDs.

In accordance with still another exemplary aspect, a standoff control mechanism is respectively associated with one or more of the plurality of rotary clamps. The standoff control mechanism, for example, is configured to selectively control a spacing between the base and the gripper member of the respective one or more of the plurality of rotary clamps. The standoff control mechanism, for example comprises a screw mechanism threadingly coupled to the sealing member, wherein a rotation of the screw mechanism controls the spacing between the base and the gripper member of the respective one or more of the plurality of rotary clamps.

The above summary is intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 4A-4E illustrate partial perspective views of various clamping positions of an exemplary workpiece clamp according to several aspects of the present disclosure.

FIGS. 5A-5E illustrate plan views of a first side of the respective workpiece clamp of FIGS. 4A-4E according to several aspects of the present disclosure.

DETAILED DESCRIPTION

Figure 1A:
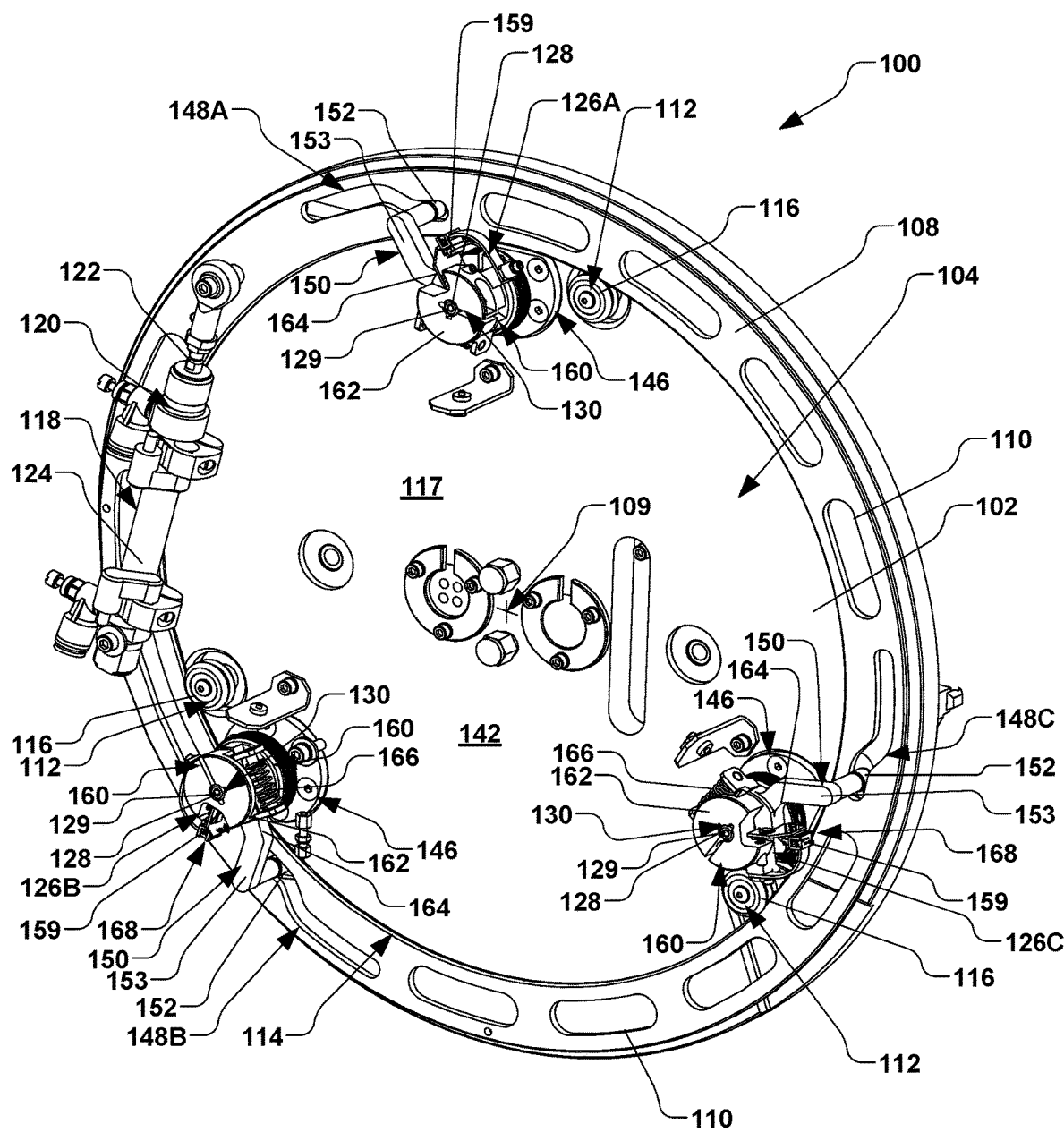
FIG. 1A is a perspective view of a first side of an exemplary workpiece clamp in accordance with several aspects of the present disclosure.

The present disclosure is directed generally toward a system, apparatus, and method for selectively retaining a workpiece in an isolated environment, as well as for remotely sensing the proper retention of the workpiece. In particular, a clamping assembly is provided for sensing of the proper retention and/or position of the workpiece is performed outside of the isolated environment, whereby no electronics or wiring associated with said sensing is present within the isolated environment.

Accordingly, the present invention will now be described with reference to the drawings, wherein like reference numerals may be used to refer to like elements throughout.

It will be understood that the description provided herein is merely illustrative and that this detailed description should not be interpreted in a limiting sense. In the following description, for purposes of explanation, numerous specific details are set forth in order to provide a thorough understanding of the present invention. It will be evident to one skilled in the art, however, that the present invention may be practiced without certain of these specific details. Further, the scope of the invention is not intended to be limited by the embodiments or examples described hereinafter with reference to the accompanying drawings, but is intended to be only limited by the appended claims and substantial equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented via wireless communication, unless noted to the contrary.

The present disclosure resolves conventional problems associated with sensing of the proper clamping or positioning of a workpiece within a vacuum system. In accordance with one aspect of the present disclosure, an exemplary workpiece clamp 100 is provided in FIGS. 1A-1B, wherein the workpiece clamp may be utilized in a variety of semiconductor processes. For example, the workpiece clamp 100 may be utilized in conjunction with a load lock chamber, as will be discussed in further detail infra. Alternatively, variations of the workpiece clamp 100 are contemplated in other applications involving workpiece handling and clamping, such as within a process chamber (e.g., an ion implantation chamber) or in various other workpiece handling systems where a determination of proper placement and securement of a workpiece is desired. The present disclosure has particular utility in applications where a positioning of electronic sensing equipment associated with the determination of proper clamping of the workpiece is problematic due to heat or other environment factors.

Figure 1B:
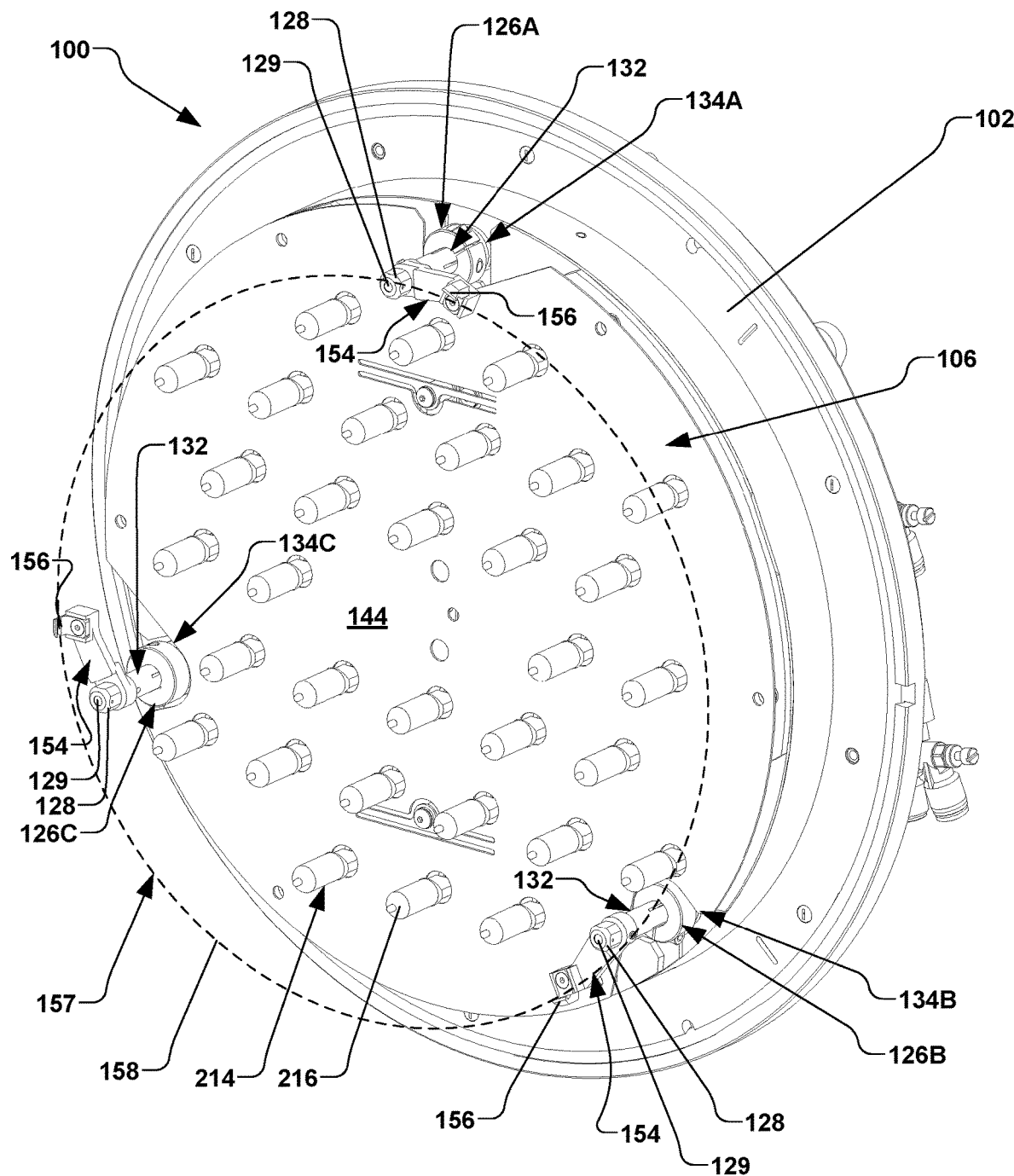
FIG. 1B is a perspective view of a second side of the exemplary workpiece clamp of FIG. 1A in accordance with several aspects of the present disclosure.

Accordingly, the workpiece clamp 100 of FIGS. 1A-1B is provided, wherein the workpiece clamp comprises a base 102 having a first side 104 illustrated in FIG. 1A and a second side 106 illustrated in FIG. 1B. The first side 104 of the base 102, for example, is generally opposite the second side 106. The workpiece clamp 100 further comprises a cam ring 108, wherein the cam ring, for example, is rotatably coupled to the first side 104 of the base of FIG. 1A. The cam ring 108, for example, is configured to rotate about a cam ring axis 109, whereby the cam ring and base 102 are generally parallel with one another. As illustrated in the example of FIG. 1A, the cam ring 108 further comprises a plurality of weight-reducing slots 110 configured to maintain a rigidity of the cam ring while reducing a weight associated therewith. It is noted, however, that the weight-reducing slots 110 may be omitted based on design and weight considerations.

FIG. 1A further illustrates a plurality of roller guides 112, for example, where the plurality of roller guides are operably coupled to the first side 104 of the base 102. The plurality of roller guides 112, for example, are configured to engage an inner diameter 114 of the cam ring 108, thereby rotatably coupling the cam ring to the base 102. In one particular example, the inner diameter 114 of the cam ring 108 is generally v-shaped, whereby the plurality of roller guides 112 comprise one or more vee bearings 116 configured to maintain a spacing between the first side 104 of the base 102 and the cam ring 108. Accordingly, a large interior area 117 is clear for various feedthroughs, electrical components, or other apparatus. Alternatively, the cam ring 108 may comprise a plate (not shown) that is rotatably coupled to the base 102 via a central bearing (not shown) positioned along the cam ring axis 109.

In the present example, the cam ring 108 and base 102 are generally parallel with one another, wherein an actuator 118 is further operably couple the base to the cam ring. The actuator 118, for example, is configured to selectively rotate the cam ring 108 with respect to the base 102 about the cam ring axis 109. In the illustrated example, the actuator 118 comprises a linear actuator 120, wherein the linear actuator is configured to selectively rotate the cam ring 108 with respect to the base 102. The linear actuator 120, for example, may comprise a piston 122 and cylinder 124, as illustrated, wherein one of the piston or cylinder is operably coupled to the base 102, and the other one of the piston or cylinder is operably coupled to the cam ring 108.

One of a pneumatic source and a hydraulic source (not shown), for example, may be further operably coupled to the linear actuator 120 (referred to as a piston and cylinder arrangement in the present example), wherein the respective one of the pneumatic source and hydraulic source is configured to extend and retract the piston 122 with respect to the cylinder 124 based on fluid pressure provided thereto. It should be noted that, while the actuator 118 is illustrated as a linear actuator 120 having a piston and cylinder arrangement in the present example, the actuator 118 may comprise various other types of actuators, such a motor accompanying a rack and pinion arrangement, a rotary actuator, electric motor, servo motor, or any other actuator operable to rotate the cam ring 108 about the cam ring axis 109 relative to the base 102.

According to another exemplary aspect, a plurality of rotary clamps 126A-126C are operably coupled to the base 102 and the cam ring 108. Each of the plurality of rotary clamps 126A-126C, for example, respectively comprises a shaft 128 that is rotatably coupled to the base 102. Each shaft 128, for example, passes through the base 102 from the first side 104 of FIG. 1A to the second side 106 of FIG. 1B, whereby each shaft is further configured to rotate about a respective shaft axis 129. Each shaft 128, for example, comprises a first portion 130 associated with the first side 104 of the base 102 and a second portion 132 associated with the second side 106 of FIG. 1B of the base.

Figure 2:
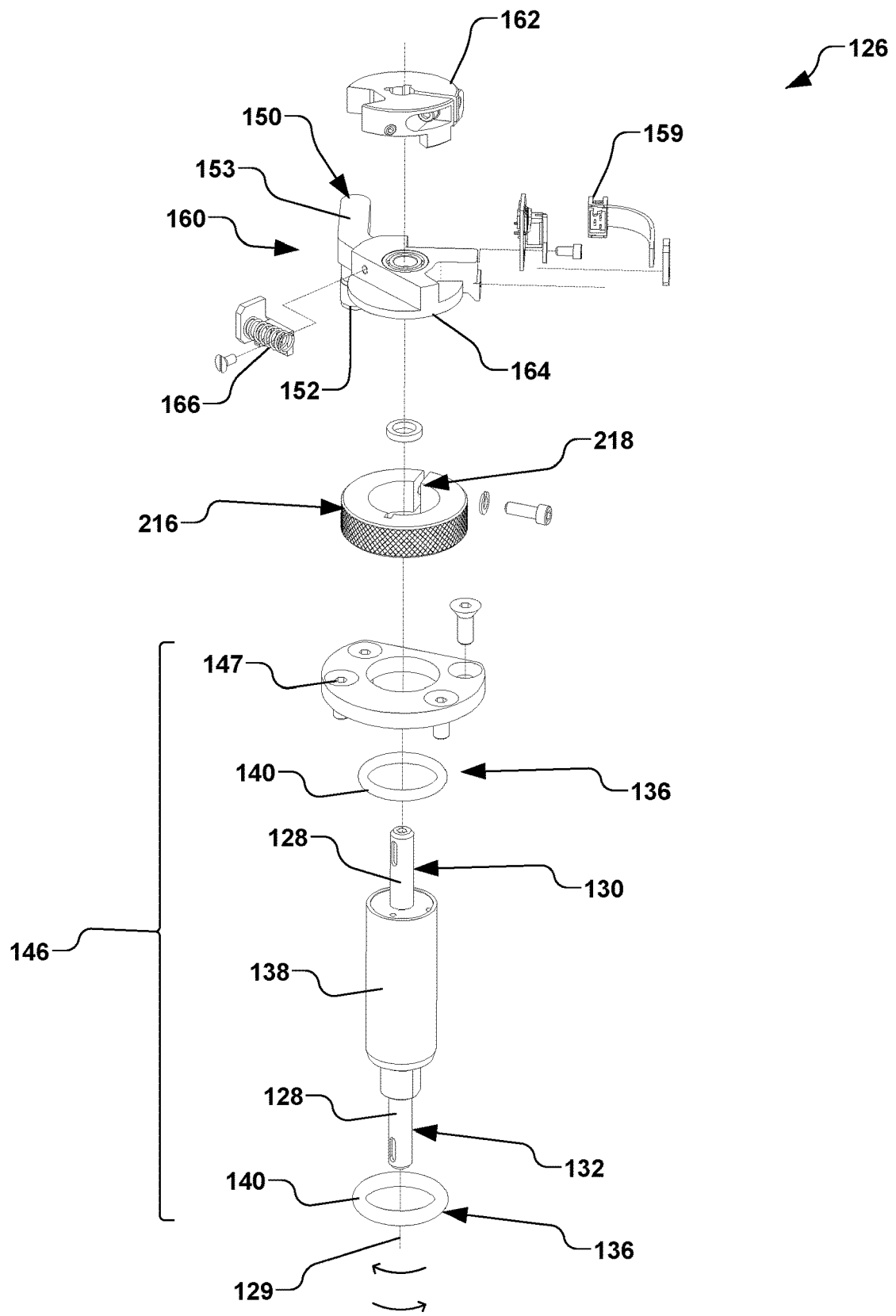
FIG. 2 is an exploded view of an exemplary rotary clamp according to several aspects of the present disclosure.

The base 102 illustrated in FIG. 1B, for example, further comprises a plurality of passages 134A-134C associated with each of the plurality of rotary clamps 126A-126C, respectively, wherein the second portion 132 of each respective shaft 128 passes through the respective passage. An exemplary rotary clamp 126 is illustrated in FIG. 2, whereby in one example, a sealing member 136 is associated with each of the plurality of passages 134A-134C in the base 102 of FIG. 1A. The sealing member 136 of FIG. 2, for example, comprises one or more of a ferrofluidic seal 138 and one or more o-rings 140, whereby the respective sealing member(s) generally isolates a first environment 142 associated with the first side 104 of the base 102 of FIG. 1A from a second environment 144 associated with the second side 106 of the base of FIG. 1B, as will be discussed in greater detail infra. The sealing member 136 (e.g., a rotational vacuum feedthrough), as in the case of the ferrofluidic seal 138 of FIG. 2, for example, may act as a rotational bearing for maintaining alignment and rotation of the shaft 128 about the shaft axis 129. The plurality of passages 134A-134C in the base 102 of FIG. 1A, for example, generally define a vacuum feed-through, whereby the sealing member 136 of FIG. 2 associated with each of the plurality of passages generally permits a rotation of the respective shaft 128, while generally preventing vacuum leakage between the first side 104 and second side 106 of the base 102 of FIGS. 1A-1B. In one example, the ferrofluidic seal 138 of FIG. 2 generally axially confines the shaft 128 along the shaft axis, while providing a rotational bearing, whereby the ferrofluidic seal and shaft are provided as a rotary feedthrough unit 146. Accordingly, a retainer 147 is operably coupled (e.g., via screws) to the first side 104 of the base 102 of FIG. 1A, therein axially retaining the rotary feedthrough unit 146, whereby the o-rings 140 provide a generally static seal for the rotary feedthrough unit to the base 102 of FIGS. 1A-1B.

In accordance with another aspect of the present disclosure, as illustrated in FIG. 1A, the cam ring 108 further comprises a plurality of cam slots 148A-148C defined therein, wherein the number or amount of cam slots correspond to the number of rotary clamps 126A-126C. As will be appreciated, any number of rotary clamps 126 and cam slots 148 may be selected based on various factors, such as the size or nature of a workpiece (not shown) to be clamped, or other factors.

A follower assembly 150, for example, is further provided with each rotary clamp 126A-126C, illustrated in FIG. 1A. Each follower assembly 150, for example, is operably coupled to the first portion 130 of each respective shaft 128. Each follower assembly 150, for example, comprises a cam follower 152 (e.g., a pin follower or roller bearing) that is radially offset from the shaft axis 129 via a cam arm 153, whereby the cam follower is configured to slidingly engage a respective one of the plurality of cam slots 148A-148C in the cam ring 108.

In accordance with the disclosure, each of the plurality of rotary clamps 126A-126C, for example, further comprises a respective workpiece engagement member 154, as illustrated in FIG. 1B, wherein the workpiece engagement member is operably coupled to the second portion 132 of the respective shaft 128. In the present example, each workpiece engagement member 154 comprises a gripper member 156 that is radially offset from the shaft axis 129, wherein each gripper member is configured to selectively engage a periphery 157 of a workpiece 158 positioned on the second side 106 of the base 102 based on position of the respective cam follower 152 with respect to the respective one of the plurality of cam slots 148A-148C.

In accordance with another aspect of the disclosure, a plurality of sensors 159 are further respectively associated with the plurality of rotary clamps 126A-126C, wherein the plurality of sensors are associated with the first side 104 of the base 102, as illustrated in FIG. 1A. By providing the plurality of sensors 159 in the first environment 142 associated with the first side 104 of the workpiece clamp 100, any electronics associated with the plurality of sensors are maintained outside of the second environment 144 of FIG. 1B, whereby heat, vacuum, or other environmental factors associated with the second environment generally do not affect the operation of the plurality of sensors. Each of the plurality of sensors 159 of FIG. 1A, for example, is configured to individually detect a rotational position associated with each respective shaft 128, wherein the rotational position of the respective shaft generally defines a clamping state of each of the respective plurality of rotary clamps 126A-126C, as will be discussed further infra.

According to one example, the first portion 130 of each shaft 128 further comprises a clutch apparatus 160, as illustrated in FIG. 1A and FIG. 2. Each clutch apparatus 160, for example, respectively comprises a first member 162 fixedly coupled to the shaft 128 and a second member 164 fixedly coupled to the follower assembly 150. The second member 164, for example, is further rotatably coupled to the shaft 128, whereby the first member 162 and second member are individually rotatable about the shaft axis 129.

The clutch apparatus 160, for example, further comprises a spring member 166 configured to rotationally bias the first member 162 with respect to second member 164 about the shaft axis 129 toward a predetermined neutral position 168, as illustrated in FIG. 1A. The neutral position 168, for example, is associated with a rotational position of the gripper member 156 when no workpiece is present, as will be discussed further infra.

For example, a spring constant is associated with the spring member 166, wherein the spring constant is associated with a predetermined clamping force between the respective gripper member 156 and the workpiece when the gripper member engages the periphery 157 of the workpiece 158 of FIG. 1B. The first member 162 and second member 164 of FIGS. 1A and 2, for example, are configured to rotate in unison until the predetermined clamping force is reached, whereby upon exceeding the predetermined clamping force, the first member is configured to maintain a fixed rotational position (e.g., a clamped position, as will be discussed infra) while the second member is configured to rotate with respect to the first member, thereby compressing the spring member 166 and rotating the second member out of the neutral position 168.

Each of the plurality of sensors 159, for example, is configured to sense the rotation of the first member 162 with respect to the second member 164 of each respective clutch apparatus 160, wherein the sensed rotation generally determines the clamping state of each respective rotary clamp 126A-126C. For example, the plurality of sensors 159 comprise one or more of a proximity sensor, a magnetic sensor, a hall sensor, and a switch operably coupled to one or more of the first member 162 and second member 162 of the clutch apparatus 160, whereby the rotation of the second member with respect to the first member changes an output of the respective sensor.

Figure 3:
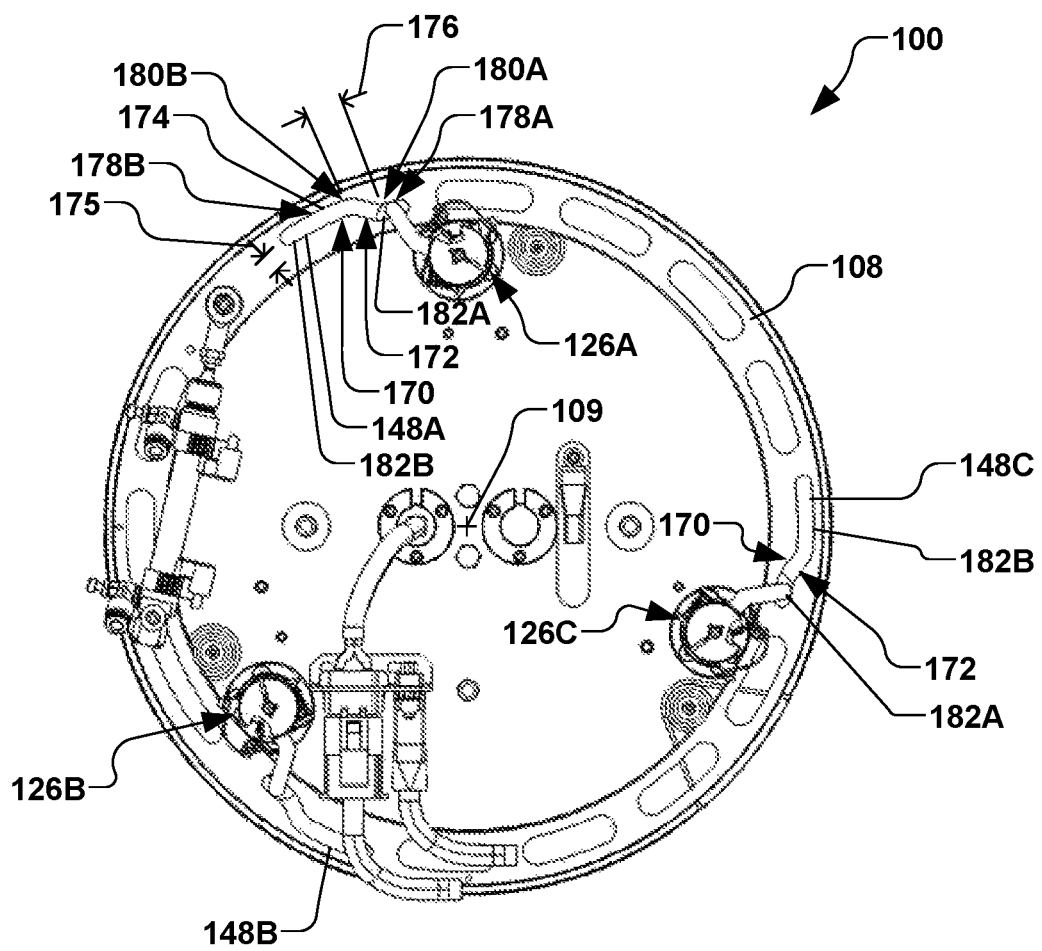
FIG. 3 is a plan view of a first side of an exemplary rotary clamp according to several aspects of the present disclosure.

In accordance with another example, as illustrated in FIG. 3, each of the plurality of cam slots 148A-148C in the cam ring 108 have a cam profile 170 having at least a workpiece engagement portion 172, as illustrated in FIG. 1A. The workpiece engagement portion 172 of the cam profile 170, for example, comprises a workpiece engagement slot 174 having a varying radial distance 175 to the cam ring axis 109 along a length 176 thereof. Accordingly, when the workpiece 158 of FIG. 1B is present, the workpiece engagement portion 172 of the cam profile 170 is configured to rotate the second member 164 of the clutch apparatus 160 illustrated in FIG. 2 about the shaft axis 129 a predetermined amount upon the cam follower 152 of each of the respective plurality of rotary clamps 126A-126C translating with respect to the plurality of cam slots 148A-148C in the cam ring 108 of FIG. 3. When no workpiece is present, the workpiece engagement portion 172 of the cam profile 170 is configured to rotate both the first member 162 and the second member 164 of the clutch apparatus 160 illustrated in FIG. 2 about the shaft axis 129 (via the spring 166 and associated predetermined spring constant) upon the cam follower 152 of each of the respective plurality of rotary clamps 126A-126C translating with respect to the plurality of cam slots 148A-148C in the cam ring 108 of FIG. 3.

According to another example, the cam profile 170 further comprises one or more run-out portions 178A, 178B adjoining one or more ends 180A, 180B, respectively, of the workpiece engagement portion 172. Each of the one or more run-out portions 178A, 178B of the cam profile 170, for example, respectively comprise radially constant slots 182A, 182B having a respective constant radial distance to the cam ring axis 109. As such, the one or more run-out portions 178A, 178B of the cam profile 170 are configured to maintain a respective rotational position of the second member 164 of the clutch apparatus 160 with respect to the first member 162 about the shaft axis 129 illustrated in FIG. 2.

In order to gain a better understanding of the configuration of the workpiece clamp 100 of the present disclosure, an exemplary operation of the workpiece clamp is further provided. In operation of the workpiece clamp 100 of FIG. 1A, for example, upon rotation of the cam ring 108 about the cam axis 109 via the actuator 118, the relative motion of the cam follower 152 of the follower assembly 150 with respect to the cam ring drives the second member 164, thus exerting a force on the spring 166, which, in turn, exerts a force on the first member 162. When the workpiece 158 of FIG. 1B is properly located with respect to the workpiece clamp 100, the workpiece engagement member 154 thus rotates until it engages the periphery 157 of the workpiece. Thus, the first member 162 and second member 164 of FIGS. 1A and 2, for example, rotate in unison.

Upon engagement of the workpiece engagement member 154 with the workpiece 158, the further rotation of the cam ring 108 drives the first member 162 of the clutch apparatus 160 to exert the predetermined clamping force on the workpiece. Further rotation of the cam ring 108 continues to maintain the predetermined clamping force (e.g., a predetermined radial load on the workpiece associated with the spring constant of the spring member 166), whereby the first member 162 maintains its fixed rotational position (e.g., the clamped position). Such further rotation of the cam ring 108 additionally rotates the second member 164 with respect to the first member, thereby compressing the spring member 166 and rotating the second member out of the neutral position 168. The plurality of sensors 159 thus sense the rotation of the second member 164 with respect to the first member 162, thus determining the clamping state of each respective rotary clamp 126A-126C.

If no workpiece 158 is present, or the workpiece is not properly aligned with the workpiece engagement member 154, the rotation of the cam ring 108 drives both the first member 162 and second member 164 of the clutch apparatus 160 in unison, whereby the above-mentioned further rotation of the cam ring 108 (e.g., beyond the clamped position) maintains the second member in the neutral position 168 with respect to the first member throughout the rotation. Accordingly, the plurality of sensors 159 are configured to sense the non-rotation of the second member 164 with respect to the first member 162, thus additionally determining the clamping state (e.g., an unclamped position or misaligned position of the workpiece) for each respective rotary clamp 126A-126C.

In order to gain a better understanding of the disclosure, FIGS. 4A-4E and 5A-5E illustrate various respective positions 190A-190E of the workpiece clamp 100 in accordance with several exemplary aspects. It is to be understood that while distinct positions 190A-190E are illustrated, such positions are not to be construed as limiting, as various positions between and beyond the positions illustrated are also contemplated, and all such positions are considered to fall within the present disclosure.

As illustrated in FIGS. 4A and 5A, for example, the workpiece clamp 100 is in a first position 190A, characterized as an unclamped position 192, wherein the gripper member 156 does not contact the workpiece 158. Upon rotation of the cam ring 108 about the base 102, the cam follower 152 translates with respect to the cam slot 148A, whereby the first member 162 and second member 164 of rotary clamp 126A do not rotate while the cam follower is within the runout portion 178B. As shown in FIG. 4A, the sensor 159 is generally closed (e.g., contacts or portions of the sensor are in close proximity to one another). As the cam follower 152 translates with respect to the cam ring 108 to be within the workpiece engagement portion 172 of the cam slot 148A, the first member 162 and second member 164 of rotary clamp 126A begin to rotate, as illustrated in FIGS. 4B and 5B. In the transition between the first position 190A of FIGS. 4A and 5A and the second position 190B of FIGS. 4B and 5B, the first member 162 and second member 164 rotate together until the gripper member 156 contacts the workpiece 158 and the predetermined clamping force is attained (e.g., via the spring member 166).

As illustrated in FIGS. 4C and 5C, once the predetermined clamping force is attained, the cam follower 152 continues to translate with respect to the cam ring 108 within the workpiece engagement portion 172 of the cam slot 148A, but the spring constant associated with the spring member 166 causes the second member 164 to continue to rotate the first member 162 remains rotationally stationary, as shown in the third position 190C. As such, the sensor 159 begins to open (e.g., the contacts or portions of the sensor begin to separate).

In FIGS. 4D and 5D, the cam follower 152 continues to translate with respect to the cam ring 108 within the cam slot 148A, whereby the cam follower comes to the end 180A of the workpiece engagement portion 172, shown in the fourth position 190D. Once the cam follower 152 comes to the end 180A of the workpiece engagement portion 172, the first member 162 and second member 164 remain rotationally stationary in the fifth position 190E. In the present example, the third, fourth, and fifth positions 190C-190E are defined as a clamped position 194, whereby the workpiece 158 is secured by the gripper member 156. The clamped position 194, for example, is further indicated by position of the sensor 159 (e.g., separation of the contacts).

While not shown, it is further noted that, should the workpiece 158 not be present or be otherwise misaligned, the first member 162 and second member 164 would rotate together from the first position 190A through the fifth position 190E, whereby the sensor 159 would remain in substantially the same position throughout the rotation. Such an instance would indicate a mis-aligned or missing workpiece 158.

The present disclosure thus provides sensing of the clamping condition of workpiece clamp, whereby the clamping condition is advantageously determined external to the second environment 144 of FIG. 1B. Thus, the present disclosure advantageously resolves conventional problems that may be experienced when workpiece sensing electronics are provided the second environment 144, such as when the second environment is heated, cooled, or exposed to caustic or otherwise damaging environments.

Figure 6A:
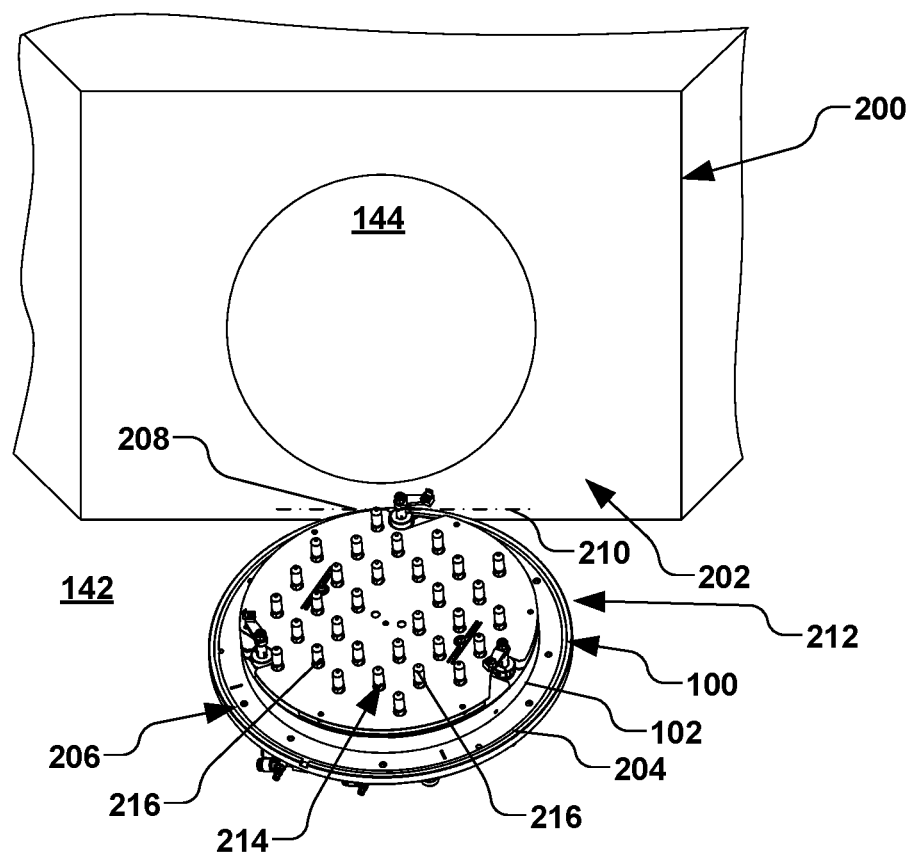
FIG. 6A illustrates a perspective view of an exemplary workpiece clamp in a horizontal position when coupled to a chamber according to several aspects of the present disclosure.
Figure 6B:
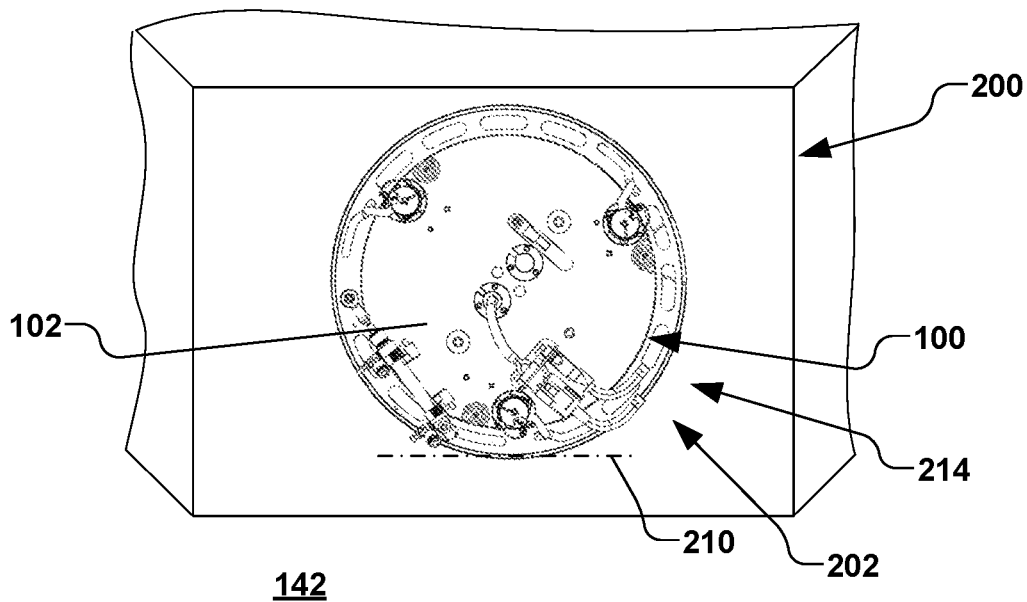
FIG. 6B illustrates a perspective view of the exemplary workpiece clamp of FIG. 6A in a vertical position according to several aspects of the present disclosure.
Figure 6C:
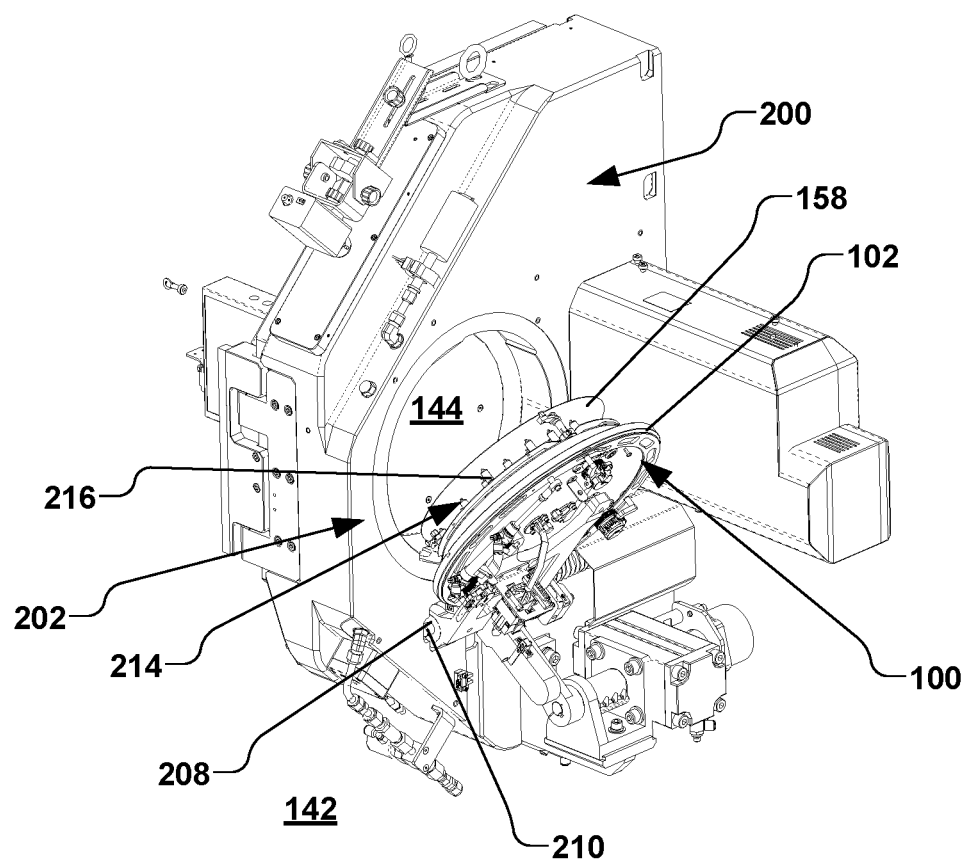
FIG. 6C illustrates another perspective view of an exemplary workpiece clamp an intermediate position according to several aspects of the present disclosure.

The workpiece clamp 100 of the present disclosure may be utilized in any application where knowledge of proper clamping of a workpiece is desired. In accordance with one exemplary aspect of the disclosure, FIGS. 6A-6B illustrate the base 102 of the workpiece clamp 100 operably coupled to a chamber 200 via a wall 202 associated with the chamber. The chamber 200, for example, may comprise a vacuum chamber, such as a load lock chamber, a thermal treatment chamber, or a process chamber. The chamber 200, for example, generally encloses the second environment 144 (e.g., a vacuum) therein, wherein a seal 204 illustrated in FIG. 6A is associated with a periphery 206 of the base 102 of the workpiece clamp 100. The seal 204, for example, generally seals the first environment 142 from the second environment 142. FIG. 6C illustrates an intermediate position 215 between a horizontal position 212 illustrated in FIG. 6A and a vertical position 214 illustrated in FIG. 6B, wherein FIG. 6C illustrates various other details of the workpiece clamp 100 and chamber 200. In the present example, the base 102 is rotatably coupled to the wall 202 of the chamber 200 via a hinge 208 or other mechanism, as illustrated in FIG. 6C, wherein the base is configured to rotate about a hinge axis 210 between the horizontal position 212 of FIG. 6A and the vertical position 214 of FIG. 6B. Accordingly, in the present example, the base 102 generally seals the second environment 144 from the first environment 142 in the vertical position 214 of FIG. 6B, while providing access to the second environment from the first environment while in the horizontal position 212 of FIG. 6A.

In accordance with another example, as illustrated in FIGS. 1B and 6A, the base 102 may further comprise a radiation source 214 disposed on the second side 106 thereof. For example, the radiation source 214 may comprise one or more thermal devices 216 generally positioned on the second side 106 of the base 102, as illustrated in FIGS. 1B and 6A, wherein the one or more thermal devices are configured to selectively heat the workpiece 158, illustrated as clamped to the base in FIG. 6C. The radiation source 214, for example, may comprise one or more of a heat lamp, a resistive heater, and a plurality of thermal LEDs.

In accordance with yet another exemplary aspect of the disclosure, as illustrated in FIG. 2, one or more of the rotary clamps 126 may comprise a standoff control mechanism 216. The standoff control mechanism 216, for example, is configured to selectively control a spacing between the base 102 and the gripper member 156 of the respective one or more of the plurality of rotary clamps. The standoff control mechanism 216, for example, comprises a screw mechanism 218 threadingly coupled to the rotary feedthrough unit 146, wherein a rotation of the screw mechanism controls the spacing between the base 102 and the gripper member 156 along the shaft axis 129 of the respective one or more of the plurality of rotary clamps 126.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A workpiece clamp, comprising:
   a base having a first side and a second side, wherein the first side is generally opposite the second side;
   a cam ring having a plurality of cam slots defined therein, wherein the cam ring and base are generally parallel with one another, and wherein the cam ring is rotatably coupled to the first side of the base;
   an actuator operably coupled to the base and cam ring, wherein the actuator is configured to selectively rotate the cam ring with respect to the base;
   a plurality of rotary clamps, wherein each of the plurality of rotary clamps respectively comprises:
      a shaft rotatably coupled to the base, wherein the shaft passes through the base from the first side to the second side and is configured to rotate about a shaft axis;
      a cam follower assembly operably coupled to a first portion of the shaft, wherein the first portion of the shaft is associated with the first side of the base, and wherein the cam follower assembly comprises a cam follower that is radially offset from the shaft axis and configured to slidingly engage a respective one of the plurality of cam slots; and
      a workpiece engagement member operably coupled to a second portion of the shaft, wherein the second portion of the shaft is associated with the second side of the base, and wherein the workpiece engagement member comprises a gripper member that is radially offset from the shaft axis and is configured to selectively engage a periphery of a workpiece positioned on the second side of the base based on position of the cam follower with respect to the respective one of the plurality of cam slots; and
   a plurality of sensors respectively associated with the plurality of rotary clamps and positioned on the first side of the base, wherein each of the plurality of sensors is configured to detect a rotational position of the respective shaft, wherein the rotational position of the respective shaft generally defines a clamping state of each of the plurality of rotary clamps, respectively.

2. The workpiece clamp of claim 1, further comprising a plurality of roller guides operably coupled to the first side of the base, wherein the plurality of roller guides engage an inner diameter of the cam ring, therein rotatably coupling the cam ring to the base.

3. The workpiece clamp of claim 2, wherein the plurality of roller guides comprise one or more vee bearings, and wherein the inner diameter of the cam ring is generally v-shaped.

4. The workpiece clamp of claim 1, wherein the actuator comprises a linear actuator.

5. The workpiece clamp of claim 4, wherein the linear actuator comprises a piston and cylinder arrangement, wherein one of the piston or cylinder is operably coupled to the base, and wherein the other one of the piston or cylinder is operably coupled to the cam ring.

6. The workpiece clamp of claim 5, further comprising one of a pneumatic source and hydraulic source operably coupled to the piston and cylinder arrangement, wherein the respective one of the pneumatic source and hydraulic source is configured to extend and retract the piston with respect to the cylinder.

7. The workpiece clamp of claim 1, wherein the first portion of each shaft further comprises a clutch apparatus, wherein the clutch apparatus comprises a first member fixedly coupled to the shaft and a second member fixedly coupled to the follower assembly, wherein the second member is rotatably coupled to the shaft, whereby the first member and second member are individually rotatable about the shaft axis.

8. The workpiece clamp of claim 7, wherein the clutch apparatus further comprises a spring member configured to rotationally bias the first member with respect to second member about the shaft axis toward a predetermined neutral position, wherein a spring constant associated with the spring member is associated with a predetermined clamping force between the gripper member and the workpiece when the gripper member engages the periphery of the workpiece, and wherein the first member and second member are configured to rotate in unison until the predetermined clamping force is reached, wherein upon exceeding the predetermined clamping force, the first member is configured to maintain a fixed rotational position while the second member is configured to rotate with respect to the first member, therein compressing the spring member.

9. The workpiece clamp of claim 8, wherein each of the plurality of sensors is configured to sense a rotation of the first member with respect to the second member of each respective clutch apparatus, therein determining the clamping state of each respective rotary clamp.

10. The workpiece clamp of claim 9, wherein the plurality of sensors comprise one or more of a proximity sensor, a magnetic sensor, a hall sensor, and a switch operably coupled to one or more of the first member and second member of the clutch apparatus.

11. The workpiece clamp of claim 1, wherein the base comprises a plurality of passages associated with each of the plurality of rotary clamps, respectively, wherein the each of the plurality of passages comprises a sealing member, wherein the second portion of the respective shaft passes through the respective passage, and wherein the respective sealing member generally isolates a first environment associated with the first side of the base from a second environment associated with the second side of the base.

12. The workpiece clamp of claim 11, wherein each sealing member comprises one or more of a rotational vacuum feed-through and an o-ring.

13. The workpiece clamp of claim 12, wherein the rotational vacuum feed-through comprises a ferrofluidic seal.

14. The workpiece clamp of claim 11, wherein the base is operably coupled to a wall of a chamber generally enclosing the second environment therein, wherein a seal is associated with a periphery of the base, and wherein the seal generally seals the first environment from the second environment.

15. The workpiece clamp of claim 14, wherein the chamber comprises a vacuum chamber selected from a group consisting of a load lock chamber, a thermal treatment chamber, and a process chamber.

16. The workpiece clamp of claim 11, further comprising a standoff control mechanism respectively associated with one or more of the plurality of rotary clamps, wherein the standoff control mechanism is configured to selectively control a spacing between the base and the gripper member of the respective one or more of the plurality of rotary clamps.

17. The workpiece clamp of claim 16, wherein the standoff control mechanism comprises a screw mechanism threadingly coupled to the sealing member, wherein a rotation of the screw mechanism controls the spacing between the base and the gripper member of the respective one or more of the plurality of rotary clamps.

18. The workpiece clamp of claim 8, wherein each of the plurality of cam slots have a cam profile having at least a workpiece engagement portion, wherein the workpiece engagement portion of the cam profile comprises a workpiece engagement slot having a varying radial distance to a center of the cam ring along a length thereof, wherein the workpiece engagement portion of the cam profile is configured to rotate the second member of the clutch apparatus about the shaft axis a predetermined amount upon the cam follower translating with respect to the cam ring.

19. The workpiece clamp of claim 18, wherein the cam profile further comprises one or more run-out portions adjoining one or more ends of the workpiece engagement portion, respectively, wherein each of the one or more run-out portions of the cam profile respectively comprises a radially constant slot having a respective constant radial distance to the center of the cam ring, wherein the one or more run-out portions of the cam profile are configured to maintain a respective one or more rotational positions of the second member of the shaft about the shaft axis.

20. The workpiece clamp of claim 14, further comprising one or more thermal devices positioned on the second side of the base, wherein the one or more thermal devices are configured to selectively heat the workpiece.

21. The workpiece clamp of claim 14, wherein the base is rotatably coupled to the wall of the chamber via a hinge, wherein the base is configured to rotate about a hinge axis between a horizontal position and a vertical position.

22. The workpiece clamp of claim 21, wherein the base generally seals the second environment from the first environment in the vertical position and provides access to the second environment from the first environment in the horizontal position.

23. The workpiece clamp of claim 1, wherein each of the plurality of cam slots have a cam profile having at least a workpiece engagement portion, wherein the workpiece engagement portion of the cam profile comprises a radially varying slot having a varying radial distance to a center of the cam ring, wherein the workpiece engagement portion of the cam profile is configured to rotate the second portion of the shaft about the shaft axis a predetermined amount upon the cam follower translating with respect to the cam ring.

24. The workpiece clamp of claim 23, wherein the cam profile further comprises one or more run-out portions adjoining one or more ends of the workpiece engagement portion, respectively, wherein each of the one or more run-out portions of the cam profile respectively comprises a radially constant slot having a respective constant radial distance to the center of the cam ring, wherein the one or more run-out portions of the cam profile are configured to maintain a respective one or more rotational positions of the second portion of the shaft about the shaft axis.

25. The workpiece clamp of claim 1, wherein the base further comprises a radiation source disposed on the second side thereof, wherein the radiation source is configured to selectively heat the workpiece.

26. The workpiece clamp of claim 25, wherein the radiation source comprises one or more of a heat lamp, a resistive heater, and a plurality of thermal LEDs.

\* \* \* \* \*